(12) United States Patent
Park et al.

(10) Patent No.: US 12,477,938 B2
(45) Date of Patent: Nov. 18, 2025

(54) DISPLAY DEVICE WITH LOW REFLECTIVE COMPONENTS

(71) Applicant: SAMSUNG DISPLAY CO., LTD., Yongin-si (KR)

(72) Inventors: Hong-Jo Park, Asan-si (KR); Soo-Hye Ryu, Yongin-si (KR); Jinsu Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 476 days.

(21) Appl. No.: 18/058,668

(22) Filed: Nov. 23, 2022

(65) Prior Publication Data

US 2023/0284478 A1     Sep. 7, 2023

(30) Foreign Application Priority Data

Mar. 3, 2022   (KR) .................. 10-2022-0027435

(51) Int. Cl.
*H10K 50/86* (2023.01)
*H10K 59/122* (2023.01)
*H10K 59/38* (2023.01)
*H10K 59/40* (2023.01)

(52) U.S. Cl.
CPC ......... *H10K 50/865* (2023.02); *H10K 59/122* (2023.02); *H10K 59/38* (2023.02); *H10K 59/40* (2023.02)

(58) Field of Classification Search
CPC .... H10K 50/865; H10K 59/122; H10K 59/38; H10K 59/40; H10K 59/879; H10K 59/8792; H10K 50/85; H10K 50/805; H10K 50/844
See application file for complete search history.

(56) References Cited

U.S. PATENT DOCUMENTS

| | | |
|---|---|---|
| 10,510,810 B2 | 12/2019 | Kim et al. |
| 10,707,280 B2 | 7/2020 | Jeong et al. |
| 11,165,049 B2 | 11/2021 | Joo et al. |

FOREIGN PATENT DOCUMENTS

| | | |
|---|---|---|
| KR | 10-2018-0082661 | 7/2018 |
| KR | 10-2020-0054382 | 5/2020 |
| KR | 10-2021-0124141 | 10/2021 |

*Primary Examiner* — Donald L Raleigh
(74) *Attorney, Agent, or Firm* — F. CHAU & ASSOCIATES, LLC

(57) ABSTRACT

A display device includes luminous and non-luminous areas. The display device includes a display element layer, an optical control layer, and a low reflective window, stacked in the order provided. The low reflective window has SCI reflectivity of 4.12% or less. The display element layer includes a pixel definition film where a pixel opening that does not overlap the luminous area is defined. A first electrode is exposed through the pixel opening. An emission layer is disposed on the first electrode. A second electrode is disposed on the emission layer. A low reflective layer is disposed on the second electrode and includes bismuth (Bi) and/or ytterbium (Yb). The optical control layer includes a color pattern part that does not overlap the luminous area, and an overcoat layer disposed on the color pattern part and overlapping the luminous and non-luminous areas.

20 Claims, 9 Drawing Sheets

DISPLAY DEVICE WITH LOW REFLECTIVE COMPONENTS

CROSS-REFERENCE TO RELATED APPLICATIONS

This U.S. non-provisional patent application claims priority under 35 U.S.C. § 119 to Korean Patent Application No. 10-2022-0027435, filed on Mar. 3, 2022 in the Korean Intellectual Property Office (KIPO), the entire contents of which are hereby incorporated by reference.

TECHNICAL FIELD

The present disclosure relates to a display device and, more specifically, to a display device including an optical control layer including a color pattern part and an overcoat layer.

DISCUSSION OF THE RELATED ART

Various types of display devices are used in multimedia devices such as televisions, cellular phones, smart phones, tablet computers, and portable game consoles. Such display devices may include various optical function layers to provide users with images and videos having excellent display quality.

SUMMARY

A display device includes a luminous area and a non-luminous area. The display device further includes a display element layer, an optical control layer disposed on the display element layer, and a low reflective window disposed on the optical control layer. The display element layer includes a pixel definition film in which a pixel opening non-overlapping the luminous area is defined, a first electrode exposed through the pixel opening, an emission layer disposed on the first electrode, a second electrode disposed on the emission layer, and a low reflective layer disposed on the second electrode. The low reflective layer includes bismuth (Bi) and/or ytterbium (Yb). The optical control layer includes a color pattern part that does not overlap the luminous area and an overcoat layer disposed on the color pattern part and overlapping the luminous area and the non-luminous area.

The display device may further include an ultraviolet blocking layer disposed between the display element layer and the optical control layer and/or disposed between the optical control layer and the low reflective window. The ultraviolet blocking layer may have a transmittance of about 10% or less with respect to light in a wavelength region of about 410 nm or less.

The low reflective window may have a specular component include (SCI) reflectivity of about 4.12% or less.

The color pattern part may include a first colorant, or the color pattern part may include the first colorant and a black colorant, and the first colorant may include a red colorant, a green colorant, and/or a blue colorant.

A weight of the first colorant may be less than about 50 wt % based on a total weight of the color pattern part.

Where the color pattern part includes any one colorant among the red colorant, the green colorant, and the blue colorant, a weight of any one colorant may be about 15 wt % or less based on a total weight of the color pattern part, and where the color pattern part includes any two colorants among the red colorant, the green colorant, and the blue colorant, a weight of each of the any two colorants may be about 15 wt % or less based on a total weight of the color pattern part.

The color pattern part may have an optical density (OD) of about 1.0 or more per 1 µm of a unit thickness.

The color pattern part may have a transmittance of about 80% or more with respect to light in a wavelength region of about 940 nm or more and may have a specular component include (SCI) reflectivity of less than about 5%.

The low reflective layer may have a refractive index of about 1.4 to about 3.0, and may have an absorption coefficient (k) of about 1.5 or less.

The display element layer may further include a capping layer disposed between the second electrode and the low reflective layer. A thickness of the second electrode may be about 95 Å to about 200 Å. A thickness of the capping layer may be about 200 Å to about 1000 Å. A thickness of the low reflective layer may be about 50 Å to about 150 Å.

The display element layer may further include an encapsulation part disposed on the low reflective layer. The encapsulation part may include a first encapsulation layer, a second encapsulation layer, and a third encapsulation layer, stacked in this order. A refractive index of the second encapsulation layer may be smaller than each of a refractive index of the first encapsulation layer and a refractive index of the third encapsulation layer.

The refractive index of the first encapsulation layer may be about 1.6 to about 2.2. The refractive index of the second encapsulation layer may be about 1.2 to about 1.8. The refractive index of the third encapsulation layer may be about 1.5 to about 2.1.

The first encapsulation layer may include silicon nitride. The second encapsulation layer and the third encapsulation layer may each include silicon oxynitride. A thickness of the first encapsulation layer may be about 200 Å to about 3000 Å. A thickness of the second encapsulation layer may be about 500 Å to about 4000 Å. A thickness of the third encapsulation layer may be about 4000 Å to about 12000 Å.

The display device may further include an input sensitive layer disposed between the display element layer and the optical control layer. The input sensitive layer may include a first conductive layer, a second conductive layer disposed on the first conductive layer, and a touch insulating layer disposed between the first conductive layer and the second conductive layer. The touch insulating layer and/or the overcoat layer may include a second colorant. The second colorant may include a red colorant, a green colorant, and/or a blue colorant.

The second colorant may absorb light in a wavelength region of about 420 nm to about 440 nm, or about 570 nm to about 590 nm.

Where the touch insulating layer includes the second colorant, a weight of the second colorant may be about 3 wt % or less based on a total weight of the touch insulating layer. Where the overcoat layer includes the second colorant, a weight of the second colorant may be about 3 wt % or less based on a total weight of the overcoat layer.

Where the touch insulating layer includes the second colorant, the touch insulating layer may have a transmittance of about 90% or more with respect to light in a wavelength region of about 380 nm to about 780 nm. Where the overcoat layer includes the second colorant, the overcoat layer may have a transmittance of about 90% or more with respect to light in a wavelength region of about 380 nm to about 780 nm.

A display device includes a display element layer, an optical control layer disposed on the display element layer, and a low reflective window disposed on the optical control layer. The low reflective window has a specular component include (SCI) reflectivity of about 4.12% or less. The display element layer includes a pixel definition film in which a pixel opening is defined, a first electrode exposed through the pixel opening, an emission layer disposed on the first electrode, a second electrode disposed on the emission layer, and a low reflective layer disposed on the second electrode and including bismuth (Bi) and/or ytterbium (Yb). The optical control layer includes a color pattern part in which a pattern opening overlapping the pixel opening is defined. The color pattern part includes a red colorant, a green colorant, and/or a blue colorant. An overcoat layer fills the pattern opening on the color pattern part and is optically transparent.

The overcoat layer may include an optical clear adhesive (OCA) and/or a pressure sensitive adhesive (PSA).

The display device may further include an ultraviolet blocking layer disposed between the display element layer and the optical control layer and/or disposed between the optical control layer and the low reflective window. The ultraviolet blocking layer may have a transmittance of about 10% or less with respect to light in a wavelength region of about 410 nm or less.

BRIEF DESCRIPTION OF THE FIGURES

The accompanying drawings are included to provide a further understanding of the inventive concept and are incorporated in and constitute a part of this specification. The drawings illustrate embodiments of the inventive concept and, together with the description, serve to explain principles of the inventive concept. In the drawings.

DETAILED DESCRIPTION

Figure 1:
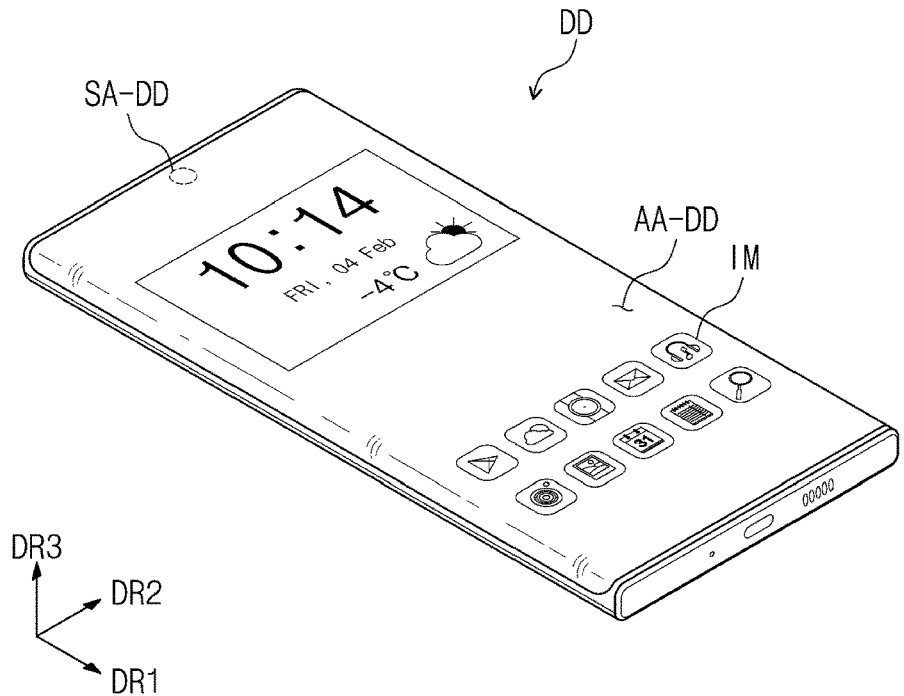
FIG. 1 is a perspective view of a display device according to an embodiment of the present disclosure.

The inventive concept may have various modifications and may be embodied in different forms, and example embodiments will be explained in detail with reference to the accompany drawings. The inventive concept may, however, be embodied in different forms and should not necessarily be construed as limited to the embodiments set forth herein. Rather, all modifications, equivalents, and substituents which are included in the spirit and technical scope of the inventive concept should be included in the inventive concept.

In the description, when an element (or a region, a layer, a part, etc.) is referred to as being "on", "connected with" or "combined with" another element, it can be directly connected with/bonded on the other element, or intervening third elements may also be disposed.

Like reference numerals may refer to like elements throughout the specification and the drawings. In the drawings, although the thicknesses, ratios, angles, and dimensions of elements represent at least one embodiment of the present invention, to scale, it should be understood that changes may be made to these values within the scope of the present disclosure. "and/or" may include one or more combinations that may define relevant elements.

It will be understood that, although the terms first, second, etc. may be used herein to describe various elements, these elements should not necessarily be limited by these terms. These terms are used to distinguish one element from another element. For example, a first element could be termed a second element without departing from the scope of the present invention. Similarly, a second element could be termed a first element. As used herein, the singular forms are intended to include the plural forms as well, unless the context clearly indicates otherwise.

In addition, the terms "below", "beneath". "on" and "above" are used for explaining the relation of elements shown in the drawings. The terms are relative concept and are explained based on the direction shown in the drawing.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Figure 2:
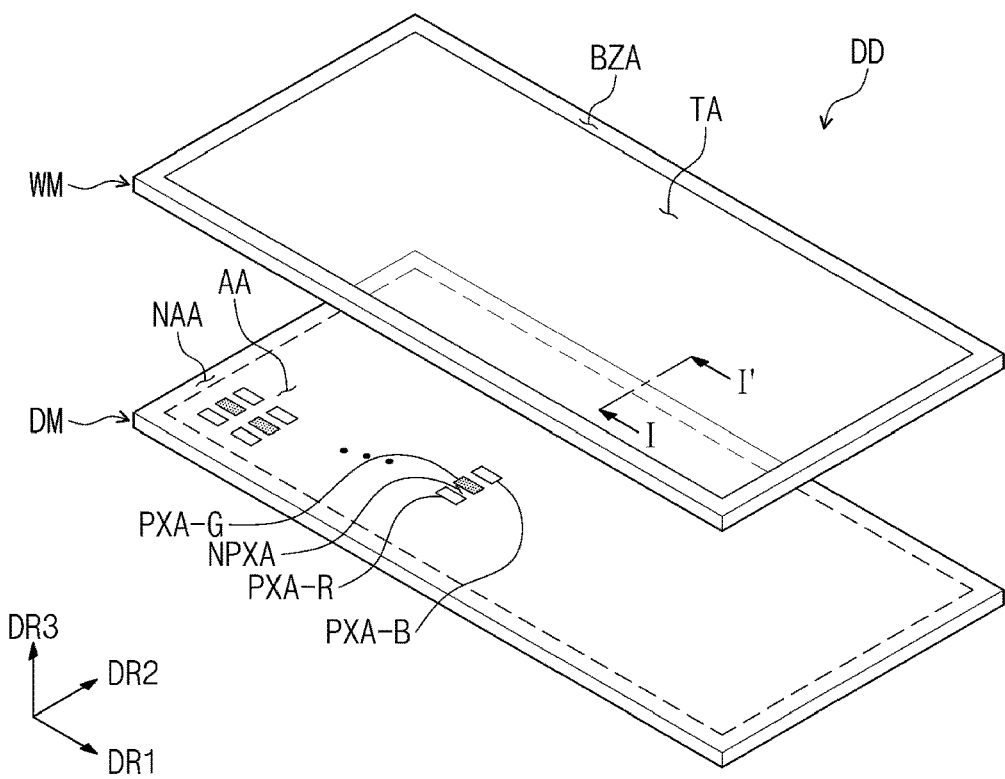
FIG. 2 is an exploded perspective view of a display device according to an embodiment of the present disclosure.

Hereinafter, the display device according to an embodiment of the inventive concept will be explained referring to the drawings. FIG. 1 is a perspective view of a display device according to an embodiment of the present disclosure. FIG. 2 is an exploded perspective view of a display device according to an embodiment of the present disclosure.

A display device DD according to an embodiment of the present disclosure, shown in FIG. 1 may be a device activated by electrical signals. For example, the display device DD may be a component of a cellular phone, a smart phone, a tablet computer, a vehicle navigation system, a portable game console, or a wearable device, but an embodiment of the inventive concept is not necessarily limited thereto. In FIG. 1, the display device DD is a cellular phone/smartphone as an embodiment.

The display device DD, according to an embodiment of the present disclosure, may display images IM through an active area AA-DD. The active area AA-DD may include a plane defined by a first direction axis DR1 and a second direction axis DR2. The active area AA-DD may include a curved surface bent from at least one side of the plane defined by the first direction axis DR1 and the second direction axis DR2. The display device DD, according to an embodiment of the present disclosure, shown in FIG. 1 includes two curved surfaces bent from both sides of the plane defined by the first direction axis DR1 and the second direction axis DR2. However, the shape of the active area AA-DD is not necessarily limited thereto. For example, the active area AA-DD may include only a plane defined by the first direction axis DR1 and the second direction axis DR2, and the active area AA-DD may further include at least two or more, for example, four curved surfaces, respectively bent from four sides of a plane defined by the first direction axis DR1 and the second direction axis DR2.

The display device DD, according to an embodiment of the present disclosure, may be flexible. The term "flexible" means the ability to be bent without cracking or otherwise sustaining damage thereto and may include all from a completely foldable structure to a structure bending to a degree of several nanometers. For example, the display device DD may be a foldable display device. In addition, the display device DD may be rigid.

In the active area AA-DD of the display device DD, a sensing area SA-DD may be defined. In FIG. 1, one sensing area SA-DD is shown as an embodiment of the present disclosure, but the number of the sensing area SA-DD is not necessarily limited thereto. The sensing area SA-DD may be a part of the active area AA-DD. The display device DD may display images through the sensing area SA-DD.

Toward the sensing area SA-DD, light signals, for example, ultraviolet light or infrared light may be permitted to travel. The display device DD may include an electronic module that takes an external image through the ultraviolet light passing through the sensing area SA-DD or judging the access of an external object through infrared light.

In FIG. 1 and the drawings below, a first direction axis DR1 to a third direction axis DR3 are shown, and the directions indicated by the first to third direction axes DR1, DR2 and DR3, explained in the description have relative concept and may be changed into other directions. In addition, the directions indicated by the first to third direction axes DR1, DR2 and DR3 may be explained as first to third directions, and the same reference symbols may be used. In the description, the first direction axis DR1 and the second direction axis DR2 may be orthogonal to each other, and the third direction axis DR3 may be a normal direction with respect to a plane defined by the first direction axis DR1 and the second direction axis DR2.

The thickness direction of the display device DD may be a third direction DR3 which is a normal direction with respect to a plane defined by the first direction axis DR1 and the second direction axis DR2. In the description, the front (or top) and the rear (or bottom) of the structures composing the display device DD may be defined based on the third direction axis DR3.

Referring to FIG. 2, the display device DD may include a display module DM and a low reflective window WM disposed on the display module DM. In an embodiment of the present disclosure, the low reflective window WM may show a specular component include (SCI) reflectivity reduced by about 2% or more compared to a common window. A common window may have a SCI reflectivity of about 3.9% to about 4.2%. The low reflective window WM having a SCI reflectivity reduced by about 2% or more from the SCI reflectivity of the common window may contribute to the increase of the reflectivity of the display device DD. Accordingly, in an embodiment of the present disclosure, the display device DD including the low reflective window WM may show increased properties of display quality and visibility.

The low reflective window WM, according to an embodiment of the present disclosure, may have a SCI reflectivity of about 4.12% or less. The SCI reflectivity of about 4.12% may be a value obtained by crossing the SCI reflectivity of about 4.2% with 0.98. For example, the low reflective window WM may have a SCI reflectivity of about 3.82% or less, and the SCI reflectivity of about 3.82% may be a value obtained by crossing the SCI reflectivity of about 3.9% with 0.98. More particularly, the low reflective window WM may have a SCI reflectivity of about 3.72% or less. However, this is an embodiment of the present disclosure, and an embodiment of the inventive concept is not necessarily limited thereto.

The low reflective window WM may include a transmissive part TA and a bezel part BZA. The transmissive part TA may be a part corresponding to the active area AA of the display module DM, and the bezel part BZA may be a part corresponding to the surrounding area NAA of the display module DM. The bezel part BZA may define the shape of the transmissive part TA. The bezel part BZA may be adjacent to the transmissive part TA and may at least partially surround the transmissive part TA. The bezel part BZA may be disposed adjacent to one side of the transmissive part TA, and a portion may be omitted.

The display module DM may have a configuration producing images and sensing external input. In the display module DM, an active area AA and a surrounding area NAA may be defined. The active area AA may be an area activated by electrical signals. The surrounding area NAA may be an area positioned adjacent to at least one side of the active area AA. In the surrounding area NAA, a driving circuit or a driving wiring, or the like for driving the active area AA may be disposed.

The display device DD according to an embodiment of the present disclosure may include multiple luminous areas PXA-R, PXA-G and PXA-B. For example, the display device DD according to an embodiment of the present disclosure may include a first luminous area PXA-R, a second luminous area PXA-G, and a third luminous area PXA-B. The first luminous area PXA-R, the second luminous area PXA-G, and the third luminous area PXA-B may emit light in different wavelength regions. The first luminous area PXA-R may be a red light emitting area emitting red light, the second luminous area PXA-G may be a green light emitting area emitting green light, and the third luminous area PXA-B may be a blue light emitting area emitting blue light.

On a plane defined by the first direction axis DR1 and the second direction axis DR2, the first to third luminous areas PXA-R, PXA-G and PXA-B may be non-overlapped but may be distinguished from one another. Between neighboring luminous areas PXA-R, PXA-G and PXA-B, a non-luminous area NPXA may be disposed.

In the display device DD, according to an embodiment of the present disclosure illustrated in FIG. 2, the luminous areas PXA-R, PXA-G and PXA-B are arranged in a stripe shape. In the display device DD, the luminous areas PXA-R, PXA-G and PXA-B may be arranged in the order of the first luminous area PXA-R, the second luminous area PXA-G and the third luminous area PXA-B by turns, according to the second direction axis DR2. The arrangement type of the luminous areas PXA-R, PXA-G and PXA-B is not necessarily limited to that shown in FIG. 2, and the arrangement order of the first luminous area PXA-R, the second luminous area PXA-G and the third luminous area PXA-B may be provided by the diverse combination according to the properties of display quality required. For example, the arrangement type of the luminous areas PXA-R, PXA-G and PXA-B may be a pentile (where PENTILE™ is an arrangement of luminous areas manufactured by SAMSUNG) arrangement type or a diamond (where DIAMOND PIXEL™ is an arrangement of luminous areas manufactured by SAMSUNG) arrangement type.

The luminous areas PXA-R, PXA-G and PXA-B may have the same area. The area may mean an area on a plane defined by the first direction axis DR1 and the second direction axis DR2. However, an embodiment of the inventive concept is not necessarily limited thereto, and the areas of the luminous areas PXA-R, PXA-G and PXA-B, emitting light in different wavelength regions among the multiple luminous areas PXA-R, PXA-G and PXA-B may be different from each other. According to the properties of display quality required in the display device DD, the area ratio of the luminous areas PXA-R, PXA-G and PXA-B may be controlled diversely.

In the display device DD, according to an embodiment of the present disclosure, the areas of the luminous areas PXA-R, PXA-G and PXA-B may be reduced compared to the common display device. The display device DD, according to an embodiment of the present disclosure, does not include a polarization plate and a color filter. The common display device included a polarization plate and a color filter disposed on a display element layer. The color filter is a filter showing a certain color, including a red filter, a green filter, a blue filter, or the like, and transmits and/or converts the color of light emitted from the display element layer. The display device DD not including a polarization plate may be provided with a relatively small thickness. The display device DD according to an embodiment of the present disclosure, not including a polarization plate and a color filter may show increased transmittance and light efficiency. According to the increase of the transmittance and light efficiency of the display device DD, the areas of the luminous areas PXA-R, PXA-G and PXA-B may be provided as reduced areas. The display device DD having reduced areas of the luminous areas PXA-R, PXA-G and PXA-B may show increased reflectivity.

In addition, the shape of the luminous areas PXA-R, PXA-G and PXA-B on a plane may be variously changed. In FIG. 2, the luminous areas PXA-R, PXA-G and PXA-B are shown to have a square shape on a plane, but an embodiment of the inventive concept is not necessarily limited thereto. Each of the luminous areas PXA-R, PXA-G and PXA-B may have the shape of polygon, circle, or the like on a plane.

Figure 3:
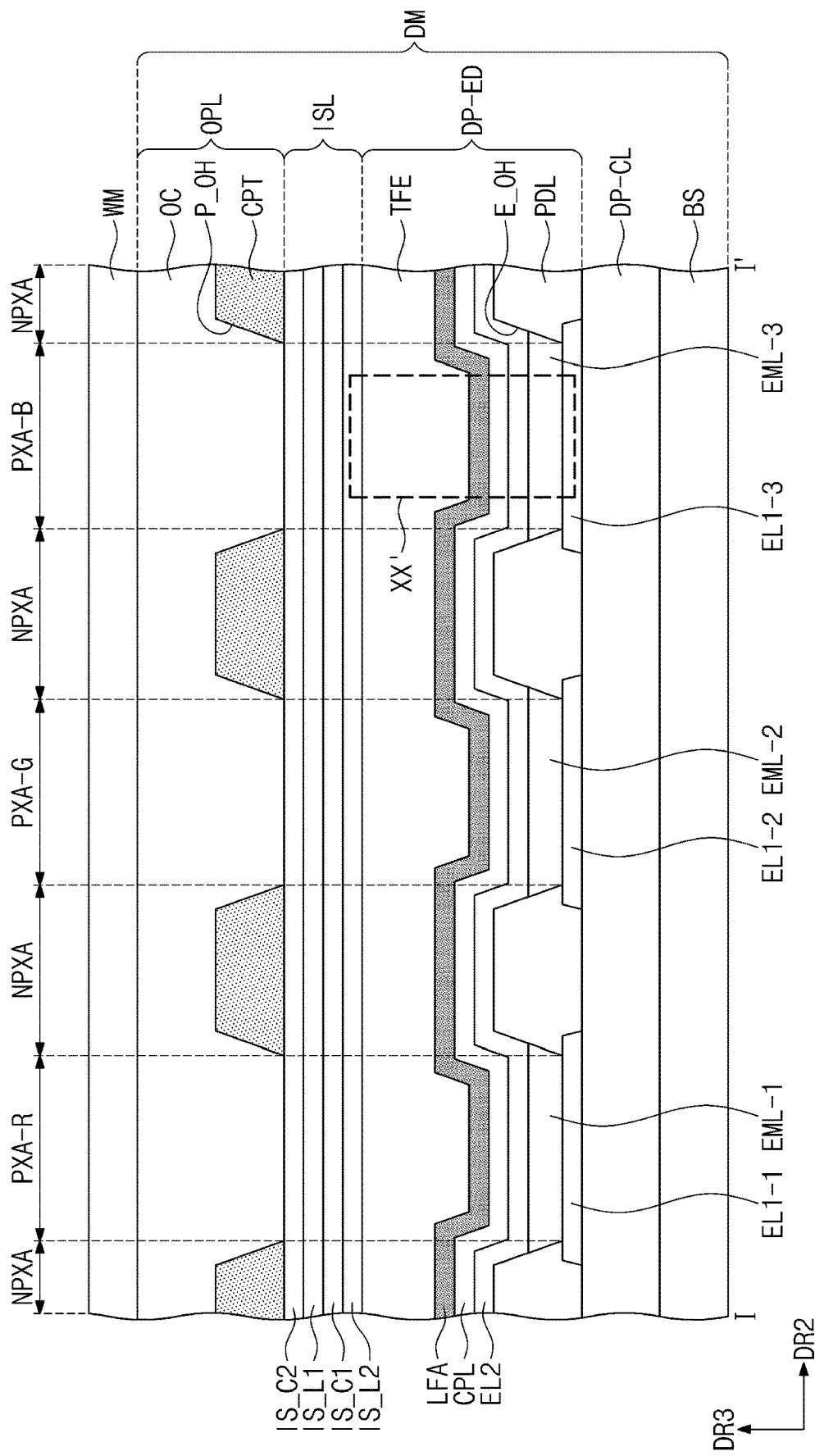
FIG. 3 is a cross-sectional view showing a part corresponding to line I-I' in FIG. 2.
Figure 4:
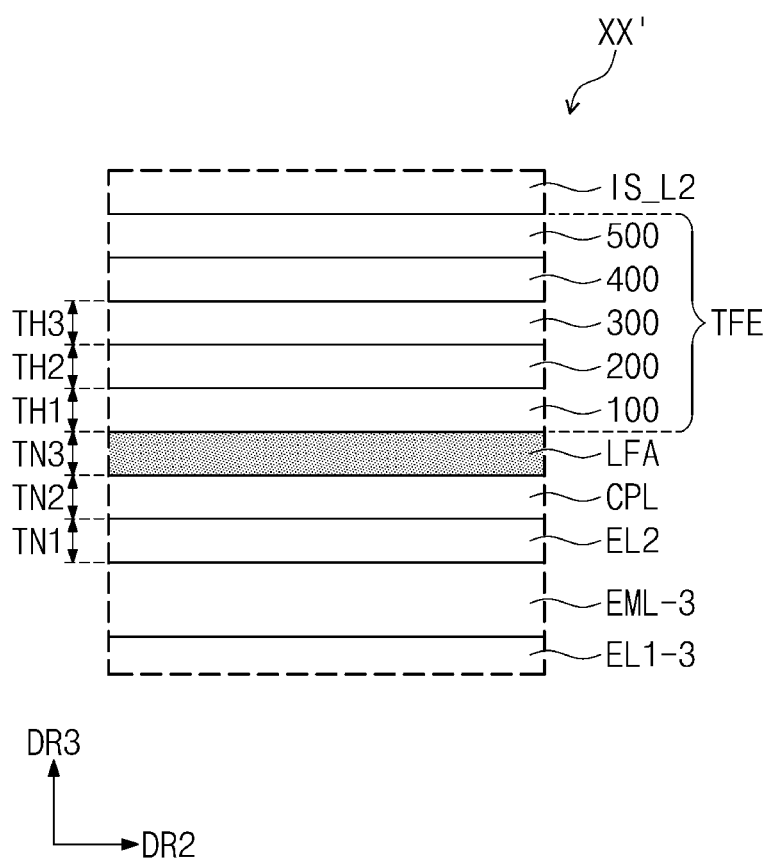
FIG. 4 is a cross-sectional view showing a part corresponding to area XX' in FIG. 3.
Figure 5:
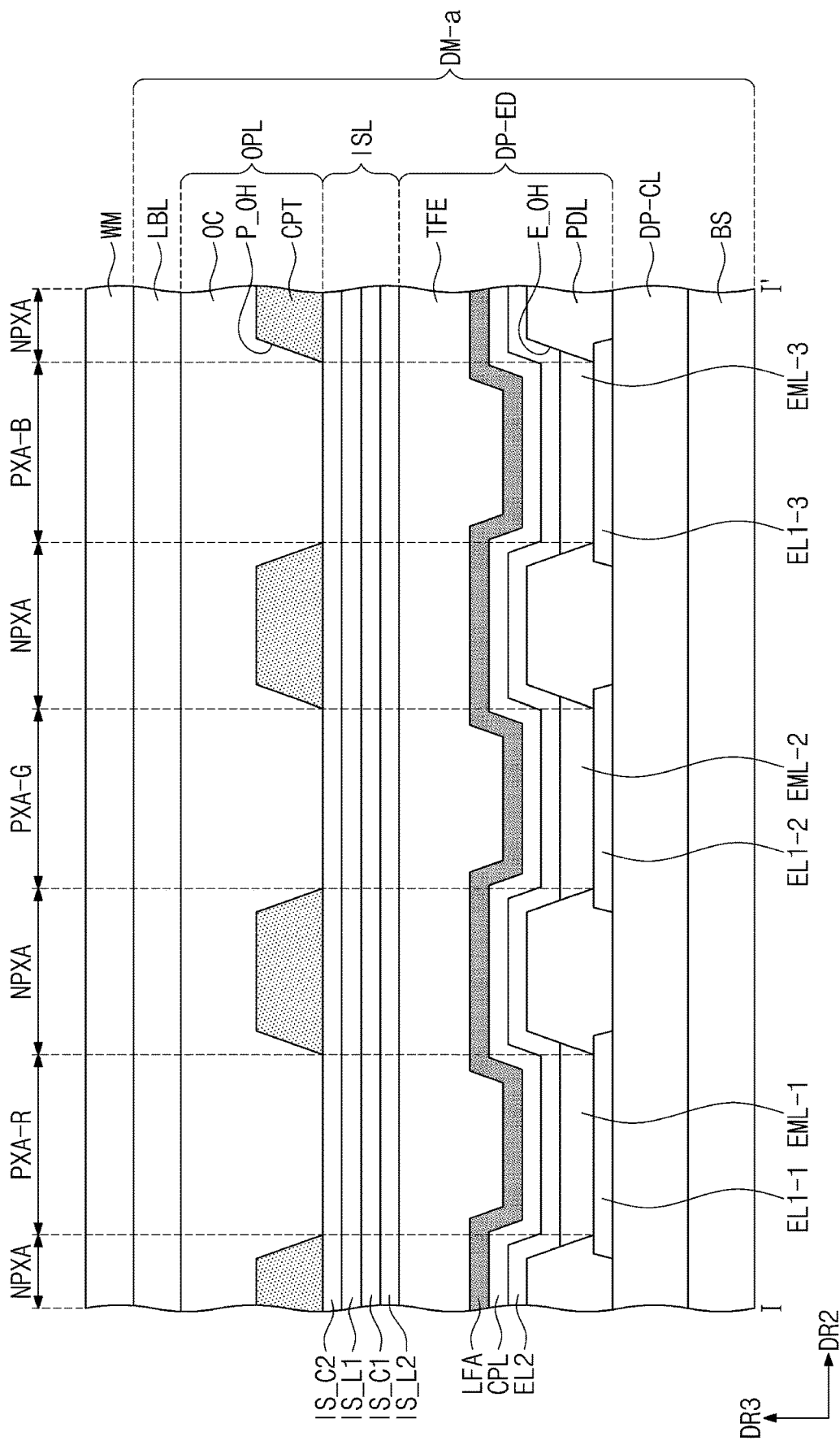
FIG. 5 is a cross-sectional view showing a display device according to an embodiment of the present disclosure.

FIG. 3 is a cross-sectional view showing a part corresponding to line I-I' in FIG. 2. FIG. 4 is a cross-sectional view showing a part corresponding to area XX' in FIG. 3.

Referring to FIG. 3, the display module DM may include a base layer BS, a circuit layer DP-CL disposed on the base layer BS, a display element layer DP-ED disposed on the circuit layer DP-CL, and an optical control layer OPL disposed on the display element layer DP-ED. The display module DM may further include an input sensitive layer ISL disposed between the display element layer DP-ED and the optical control layer OPL.

The base layer BS may be a structure providing a base surface for disposing the display element layer DP-ED. The base layer BS may be a glass substrate, a metal substrate, a polymer substrate, or the like. However, an embodiment of the inventive concept is not necessarily limited thereto, and the base layer BS may be an inorganic layer, an organic layer or a composite material layer.

The circuit layer DP-CL may include multiple transistors. Each of the transistors may include a control electrode, an input electrode and an output electrode. For example, the circuit layer DP-CL may include a switching transistor and a driving transistor for driving the elements (for example, a first electrode, an emission layer and a second electrode) of the display element layer DP-ED. In addition, the circuit layer DP-CL may include an insulating layer, a semiconductor pattern, a conductive pattern, and a signal line.

The display element layer DP-ED may include a pixel definition film PDL where a pixel opening E_OH is defined, first electrodes EL1-1, EL1-2 and EL1-3, exposed through the pixel opening E_OH, emission layers EML-1, EML-2 and EML-3 disposed on the first electrodes EL1-1, EL1-2 and EL1-3, and a second electrode EL2 disposed on the emission layers EML-1, EML-2 and EML-3. In addition, the display element layer DP-ED may include a low reflective layer LFA disposed on the second electrode EL2.

The pixel definition film PDL may be non-overlapped with the luminous areas PXA-R, PXA-G and PXA-B. The pixel definition film PDL may be overlapped with the non-luminous area NPXA. The pixel definition film PDL may have light absorption characteristics. The pixel definition film PDL may include a black coloring agent. The black coloring agent may include a black dye, or a black pigment. The black coloring agent may include carbon black, a metal such as chromium, or oxides thereof. The pixel definition film PDL may cover a portion of the first electrodes EL1-1, EL1-2 and EL1-3. In the description, the overlap of one element with another element may mean that they have the same area on a plane perpendicular to a thickness direction, or one element has a larger area than another element.

The first electrodes EL1-1, EL1-2 and EL1-3 may be anodes or cathodes. In addition, the first electrodes EL1-1, EL1-2 and EL1-3 may be pixel electrodes. The first electrodes EL1-1, EL1-2 and EL1-3 may be transmissive electrodes, transflective electrodes or reflective electrodes. If the first electrodes EL1-1, EL1-2 and EL1-3 are transmissive electrodes, the first electrodes EL1-1, EL1-2 and EL1-3 may include a transparent metal oxide, for example, indium tin oxide (ITO), indium zinc oxide (IZO), zinc oxide (ZnO), indium tin zinc oxide (ITZO), or the like. If the first electrodes EL1-1, EL1-2 and EL1-3 are transflective electrodes or reflective electrodes, the first electrodes EL1-1, EL1-2 and EL1-3 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). Otherwise, the first electrodes EL1-1, EL1-2 and EL1-3 may have a multilayer structure including a reflective layer or a transflective layer formed using the above-described material, and a transparent conductive layer formed by indium tin oxide (ITO), indium zinc oxide (IZO), zinc oxide (ZnO), indium tin zinc oxide (ITZO), or the like. For example, the first electrodes EL1-1, EL1-2 and EL1-3 may have a three-layer structure of ITO/Ag/ITO, without necessarily being limited thereto.

The display element layer DP-ED may include multiple emission layers EML-1, EML-2 and EML-3. The emission layers EML-1. EML-2 and EML-3 may be patterned and provided in the pixel opening E_OH defined in the pixel definition film PDL. The emission layers EML-1, EML-2 and EML-3 may be overlapped with the luminous areas PXA-R, PXA-G and PXA-B. The display element layer DP-ED may include a first emission layer EML-1 corresponding to the first luminous area PXA-R, a second emission layer EML-2 corresponding to the second luminous area PXA-G, and a third emission layer EML-3 corresponding to the third luminous area PXA-B. The emission layers EML-1, EML-2 and EML-3 may emit light in different wavelength regions. For example, the first emission layer EML-1 may emit red light, the second emission layer EML-2 may emit green light, and the third emission layer EML-3 may emit blue light.

Each of the emission layers EML-1, EML-2 and EML-3 may include a fluorescence or phosphorescence material. Each of the emission layers EML-1, EML-2 and EML-3 may include anthracene derivatives, pyrene derivatives, fluoranthene derivatives, chrysene derivatives, dihydrobenzanthracene derivatives, or triphenylene derivatives. In addition, the emission layers EML-1, EML-2 and EML-3 may include an organometal complex as a light emitting material. The emission layers EML-1, EML-2 and EML-3 may include quantum dots as a light emitting material.

Each of the emission layers EML-1, EML-2 and EML-3 may be provides as a single layer or a multilayer. For example, if the first emission layer EML-1 is provided as a multilayer, a charge generating layer may be disposed between the multiple first emission layers EML-1. However, this is only an embodiment of the present disclosure, and the inventive concept is not necessarily limited thereto.

The second electrode EL2 may be a common electrode. The second electrode EL2 may be a cathode or an anode, but an embodiment of the inventive concept is not necessarily limited thereto. For example, if the first electrodes EL1-1, EL1-2 and EL1-3 are anodes, the second electrode EL2 may be a cathode, and if the first electrodes EL1-1, EL1-2 and EL1-3 are cathodes, the second electrode EL2 may be an anode.

The second electrode EL2 may be a transmissive electrode, a transflective electrode or a reflective electrode. If the second electrode EL2 is a transmissive electrode, the second electrode EL2 may be formed using a transparent metal oxide, for example, indium tin oxide (ITO), indium zinc oxide (IZO), zinc oxide (ZnO), indium tin zinc oxide (ITZO), or the like.

A hole transport region may be disposed between the first electrodes EL1-1, EL1-2 and EL1-3 and the emission layers EML-1, EML-2 and EML-3, and the hole transport region may include a hole transport layer, a hole injection layer, and/or an electron blocking layer. In addition, an electron transport region may be disposed between the emission layers EML-1, EML-2 and EML-3 and the second electrode EL2, and the electron transport region may include an electron transport layer, an electron injection layer, and/or a hole blocking layer. Each of the hole transport region and the electron transport region may be provided as a common layer, or may be provided by patterning in a pixel opening E_OH.

The low reflective layer LFA may include an inorganic material having a relatively low reflectivity and may include a metal or a metal oxide. The low reflective layer LFA may include bismuth (Bi) and/or ytterbium (Yb). For example, the low reflective layer LFA may be formed by depositing bismuth (Bi) or co-depositing bismuth (Bi) and ytterbium (Yb). Bismuth (Bi) and ytterbium (Yb) may be metals that may be deposited at a temperature not damaging the configuration of the emission layers EML-1, EML-2 and EML-3 disposed under the low reflective layer LFA.

The low reflective layer LFA may have a refractive index of about 1.4 to about 3.0. The low reflective layer LFA may have an absorption coefficient (k) of about 1.5 or less. For example, the low reflective layer LFA may have an absorption coefficient of greater than about 0.5 to about 1.5 or less. A low reflective layer LFA satisfying the certain refractive index range and the absorption coefficient range may reduce light reflectivity.

The low reflective layer LFA may induce the destructive interference of light incident into the display device DD and light reflected from a metal (for example, a second electrode) disposed under the low reflective layer LFA, and may reduce external light reflectivity. Accordingly, in an embodiment of the present disclosure, the display device DD including the low reflective layer LFA may increase display quality and light efficiency.

The display element layer DP-ED may further include a capping layer CPL disposed between the second electrode EL2 and the low reflective layer LFA. The capping layer CPL may include a single layer or a multilayer. The capping layer CPL may include an organic material or an inorganic material. In an embodiment of the present disclosure, the capping layer CPL may be an organic layer or an inorganic layer. For example, if the capping layer CPL includes an inorganic material, the inorganic material may include an alkali metal compound such as LiF, an alkaline earth metal compound such as $MgF_2$, silicon oxynitride, silicon nitride, silicon oxide, or the like. For example, if the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol-9-yl) triphenylamine (TCTA), or the like, or may include an epoxy resin, or acrylate such as methacrylate.

The capping layer CPL may have a refractive index of about 1.6 or more. For example, the refractive index of the capping layer CPL with respect to light in a wavelength region of about 550 nm to about 660 nm may be about 1.6 or more. The capping layer CPL may increase light efficiency by the principle of constructive interference.

Referring to FIG. 4, the thickness TN1 of the second electrode EL2 may be about 95 Å to about 200 Å. The thickness TN2 of the capping layer CPL may be about 200 Å to about 1000 Å. The thickness TN3 of the low reflective layer LFA may be about 50 Å to about 150 Å. A light travel distance, or the like may be controlled in the second electrode EL2, capping layer CPL, and low reflective layer LFA, satisfying the certain thickness ranges, and the light efficiency of the display device DD may be increased.

The display element layer DP-ED may further include an encapsulation part TFE disposed on the low reflective layer LEA. The encapsulation part TFE may encapsulate elements disposed under the encapsulation part TFE, such as the first electrodes EL1-1, EL1-2 and EL1-3, the emission layers EML-1, EML-2 and EML-3, and the second electrode EL2. The encapsulation part TFE may protect the elements from moisture, oxygen and/or foreign materials such as dust particles.

The encapsulation part TFE may include a first encapsulation layer 100, a second encapsulation layer 200 and a third encapsulation layer 300, stacked in this order. In addition, the encapsulation part TFE may further include a fourth encapsulation layer 400 disposed on the third encapsulation layer 300 and a fifth encapsulation layer 500 disposed on the fourth encapsulation layer 400.

The refractive index of the second encapsulation layer 200 may be smaller than the refractive index of the first encapsulation layer 100 and the refractive index of the third encapsulation layer 300. In the first encapsulation layer 100, the second encapsulation layer 200, and the third encapsulation layer 300, stacked in this order, the second encapsulation layer 200 which is a layer disposed in the middle based on a thickness direction has a relatively small refractive index, and the display quality of the display device DD may be increased.

For example, the refractive index of the second encapsulation layer 200 may be about 1.2 to about 1.8. The refractive index of the first encapsulation layer 100 may be about 1.6 to about 2.2. The refractive index of the third encapsulation layer 300 may be about 1.5 to about 2.1. More particularly, the refractive index of the second encapsulation layer 200 may be about 1.48, the refractive index of the first encapsulation layer 100 may be about 1.89, and the refractive index of the third encapsulation layer 300 may be about 1.77.

The thickness TH1 of the first encapsulation layer 100 may be about 200 Å to about 3000 Å. The thickness TH2 of the second encapsulation layer 200 may be about 500 Å to about 4000 Å. The thickness TH3 of the third encapsulation layer 300 may be about 4000 Å to about 12000 Å. The thickness of the third encapsulation layer 300 disposed on the top may be about 4000 Å or more, and high encapsulation reliability may be shown.

The first encapsulation layer 100, the second encapsulation layer 200 and the third encapsulation layer 300 may include an inorganic material. The first encapsulation layer 100 may include silicon nitride, and the second encapsulation layer 200 and the third encapsulation layer 300 may include silicon oxynitride each. The encapsulation part TFE may include an inorganic layer including an inorganic material and/or an organic layer including an organic material between the third encapsulation layer 300 and the fourth encapsulation layer 400.

The fourth encapsulation layer 400 may protect elements such as the emission layers EML-1, EML-2 and EML-3 from foreign materials such as dust particles. The fourth encapsulation layer 400 may include an acryl-based compound, an epoxy-based compound, or the like. The fourth encapsulation layer 400 is not necessarily limited to this arrangement as long as it includes a photopolymerizable organic material.

The fifth encapsulation layer 500 may protect elements such as the emission layers EML-1, EML-2 and EML-3 from moisture and oxygen. The fifth encapsulation layer 500 may include silicon nitride, silicon oxynitride, silicon oxide, titanium oxide, aluminum oxide, or the like, without necessarily being limited thereto. For example, the refractive index of the fifth encapsulation layer 500 may be about 1.89, and the thickness of the fifth encapsulation layer 500 may be about 5000 Å. However, this is only an embodiment of the present disclosure, and the refractive index and thickness of the fifth encapsulation layer 500 are not necessarily limited thereto.

Referring to FIG. 3 again, in an embodiment of the present disclosure, the optical control layer OPL may include a color pattern part CPT and an overcoat layer OC disposed on the color pattern part CPT. The optical control layer OPL may be formed using a material curable at a relatively low temperature. The optical control layer OPL may be formed by curing at a temperature of about 85° C. or less. On an element disposed under the optical control layer OPL, a material for forming an optical control layer OPL may be directly provided to form the optical control layer OPL. Accordingly, the damage of an element such as a display element layer DP-ED disposed under the optical control layer OPL may be prevented during a curing process.

The color pattern part CPT may include a base resin and a first colorant dispersed in the base resin. Alternatively, the color pattern part CPT may include a base resin, a first colorant dispersed in the base resin, and a black colorant dispersed in the black resin. In addition, the color pattern part CPT may further include an additive, or the like.

In the description, the colorant includes a pigment and a dye. The first colorant may include a red colorant, a green colorant, and/or a blue colorant. The color pattern part CPT may include a red pigment, a red dye, a green pigment, a green dye, a blue pigment, and/or a blue dye as the first colorant.

In addition, the color pattern part CPT may further include a black colorant. The color pattern part CPT may further include a black pigment and/or a black dye. For example, the color pattern part CPT may include a carbon black pigment and/or a lactam-based organic black pigment as the black colorant. However, this is only an embodiment of the present disclosure, and any common materials well-known in this technical field may be used as the red colorant, green colorant, blue colorant, and black colorant, without necessarily being limited thereto.

Based on the total weight of the color pattern part CPT, the first colorant may be provided in less than about 50 wt %. The color pattern part CPT may include a red colorant, a green colorant, and a blue colorant, and/or a black colorant, and the total weight of the colorant may be less than about 50 wt %. The color pattern part CPT may include all of the red colorant, the green colorant, and the blue colorant, and may not include the black colorant. If the color pattern part CPT includes all of the red colorant, the green colorant, and the blue colorant, the total weight of the red colorant, the green colorant, and the blue colorant may be less than about 50 wt %.

For example, the color pattern part CPT may include any one among the red colorant, the green colorant, and the blue colorant, and may further include the black colorant. If the color pattern part CPT includes any one among the red colorant, the green colorant, and the blue colorant, the one colorant may be provided in about 15 wt % or less based on the total weight of the color pattern part CPT. Alternatively, the color pattern part CPT may include any two among the red colorant, the green colorant, and the blue colorant, and may further include the black colorant. If the color pattern part CPT includes any two among the red colorant, the green colorant, and the blue colorant, each of the any two colorants may be provided in about 15 wt % or less based on the total weight of the color pattern part CPT. The color pattern part CPT including a colorant satisfying a certain weight range may contribute to the increase of the display quality of the display device DD. In the color pattern part CPT, by controlling the type and weight of the colorant, a display device DD having desired display quality may be provided.

In an embodiment of the present disclosure, the color pattern part CPT may have an optical density (OD) of about 1.0 or more per 1 μm of a unit thickness. If the optical density is about 1.0 or more per 1 μm of a unit thickness, the optical color pattern part CPT may show reduced reflectivity properties. The SCI reflectivity of the color pattern part CPT may be less than about 5%. The color pattern part CPT showing a SCI reflectivity of less than about 5% may contribute to the increase of the display quality of a display device DD.

The color pattern part CPT may have a transmittance of about 80% or more with respect to light in a wavelength region of about 940 nm. The light in a wavelength region of about 940 nm may be infrared light. A color pattern part CPT having a transmittance of about 80% or more with respect to light in a wavelength region of about 940 nm may show excellent transmittance properties of light signals of infrared light.

The color pattern part CPT may be non-overlapped with luminous areas PXA-R, PXA-G and PXA-B. The color pattern part CPT may be overlapped with a non-luminous area NPXA. In the color pattern part CPT, a pattern opening P_OH may be defined. The pattern opening P_OH of the color pattern part CPT may be overlapped with the pixel opening E_OH of a pixel definition film PDL. In the non-luminous area NPXA, the color pattern part CPT may be overlapped with the pixel definition film PDL.

The overcoat layer OC may be overlapped with the luminous areas PXA-R, PXA-G and PXA-B, and the non-luminous area NPXA. The overcoat layer OC may fill up the pattern opening P_OH and be disposed on the color pattern part CPT. The top of the overcoat layer OC may be adjacent to a low reflective window WM and planar. The overcoat layer OC may include an organic material. The overcoat layer OC may be optically transparent. For example, the overcoat layer (C may have a transmittance of about 85% or more with respect to light in a wavelength region of about 380 nm to about 780 nm.

An input sensitive layer ISL may include a base insulating layer IS_L2, a first conductive layer IS_C1 disposed on the base insulating layer IS_L2, a second conductive layer IS_C2 disposed on the first conductive layer IS_C1, and a touch insulating layer IS_L1 disposed between the first conductive layer IS_C1 and the second conductive layer IS_C2. The base insulating layer IS_L2 may include a single layer or a multilayer. The base insulating layer IS_L2 may include an organic material or an inorganic material. The base insulating layer IS_L2 may include silicon nitride, silicon oxynitride and/or silicon oxide. Otherwise, the base insulating layer IS_L2 may include an epoxy resin, an acrylic resin, or an imide-based resin.

Each of the first conductive layer IS_C1 and the second conductive layer IS_CL2 may include a single layer or a multilayer. Each of the first conductive layer IS_C1 and the second conductive layer IS_CL2 may include a metal layer or a transparent conductive layer as a single layer. The metal layer may include molybdenum (Mo), silver (Ag), titanium (Ti), copper (Cu), aluminum (Al), or alloys thereof. A transparent conductive layer may include a transparent conductive oxide such as indium tin oxide (ITO), indium zinc oxide (IZO), and indium tin zinc oxide (ITZO). In addition, the transparent conductive layer may include a conductive polymer such as PEDOT, a metal nanowire, graphene, or the like.

Each of the first conductive layer IS_C1 and the second conductive layer IS_CL2 may have a three-layer structure of ITO/Ag/ITO. In addition, each of the first conductive layer IS_C1 and the second conductive layer IS_CL2 may include at least one metal layer and at least one transparent conductive layer.

The touch insulating layer IS_L1 may include an inorganic material or an organic material. If the touch insulating layer IS_L1 includes an organic material a red colorant, a green colorant, and/or a blue colorant may be included.

In an embodiment of the present disclosure, the touch insulating layer IS_L1 of the input sensitive layer ISL and/or the overcoat layer OC of the optical control layer OPL may include a second colorant, and the second colorant may include a red colorant, a green colorant, and/or a blue colorant. The touch insulating layer IS_L1 and/or the overcoat layer OC may include a red pigment, a red dye, a green pigment, a green dye, a blue pigment, and/or a blue dye. The second colorant may absorb light in a wavelength region different from the wavelength region of light emitted from a display element layer DP-ED. The second colorant may absorb light in a wavelength region of about 420 nm to about 440 nm, or about 570 nm to about 590 nm.

The second colorant may be included in about 3 wt % or less in the touch insulating layer IS_L1 and/or the overcoat layer OC. If the touch insulating layer IS_L1 includes the second colorant, the second colorant may be included in about 3 wt % or less based on the total weight of the touch insulating layer IS_L1. If the overcoat layer OC includes the second colorant, the second colorant may be included in about 3 wt % or less based on the total weight of the overcoat layer OC.

A structure including the second colorant among the touch insulating layer IS_L1 and the overcoat layer OC, may have a transmittance of about 90% or more with respect to light in a wavelength region of about 380 nm to about 780 nm. If the touch insulating layer IS_L1 includes the second colorant, the touch insulating layer IS_L1 may have a transmittance of about 90% or more with respect to light in a wavelength region of about 380 nm to about 780 nm. A display device DD including the touch insulating layer IS_L1 or the overcoat layer OC, having a transmittance of about 90% or more with respect to light in a wavelength region of about 380 nm to about 780 nm, may show excellent display quality.

A structure including the second colorant in about 3 wt % or less among the touch insulating layer IS_L1 and the overcoat layer OC, may contribute to the increase of the display quality of a display device DD. By controlling the type and weight range of the second colorant in at least one structure among the touch insulating layer IS_L1 and the overcoat layer OC, a display device DD having desired display quality may be provided.

A structure including the second colorant among the touch insulating layer IS_L1 and the overcoat layer OC, may be formed using a material curable at a low temperature. The structure including the second colorant may be cured at a temperature of about 85° C. or less and formed. On an element (for example, a first conductive layer and/or a second conductive layer) disposed under the structure including the second colorant, a material for forming the structure including the second colorant may be directly provided to form the structure including the second colorant. Accordingly, the damage of an element such as a display element layer DP-ED disposed under the structure including the second colorant may be prevented during a curing process.

FIG. 5 to FIG. 8 are cross-sectional views showing another embodiments of the display device of the inventive concept. In the explanation on FIG. 5 to FIG. 8, overlapped contents with the explanation referring to FIG. 1 to FIG. 4 will not be given, and the explanation will be focused on the differences.

A display device DD according to an embodiment of the present disclosure may further include an ultraviolet blocking layer LBL disposed in at least one between a display element layer DP-ED and an optical control layer OPL, or between an optical control layer OPL and a low reflective window WM. When compared to the display module DM explained referring to FIG. 3, it could be found that a display module DM-a shown in FIG. 5 includes the ultraviolet blocking layer LBL between the optical control layer OPL and the low reflective window WM.

The ultraviolet blocking layer LBL may have a transmittance of about 10% or less with respect to light in a wavelength region of about 410 nm or less. The ultraviolet blocking layer LBL may include an absorbent absorbing light in a wavelength region of about 410 nm or less. The light in the wavelength region of about 410 nm or less may be ultraviolet light. The ultraviolet blocking layer LBL having a transmittance of about 10% or less with respect to light in a wavelength region of about 410 nm or less, may minimize or prevent the damage of an element such as a display element layer DP-ED by ultraviolet light, or the like. Accordingly, a display device DD including the ultraviolet blocking layer LBL according to an embodiment of the present disclosure may show excellent reliability.

Figure 6:
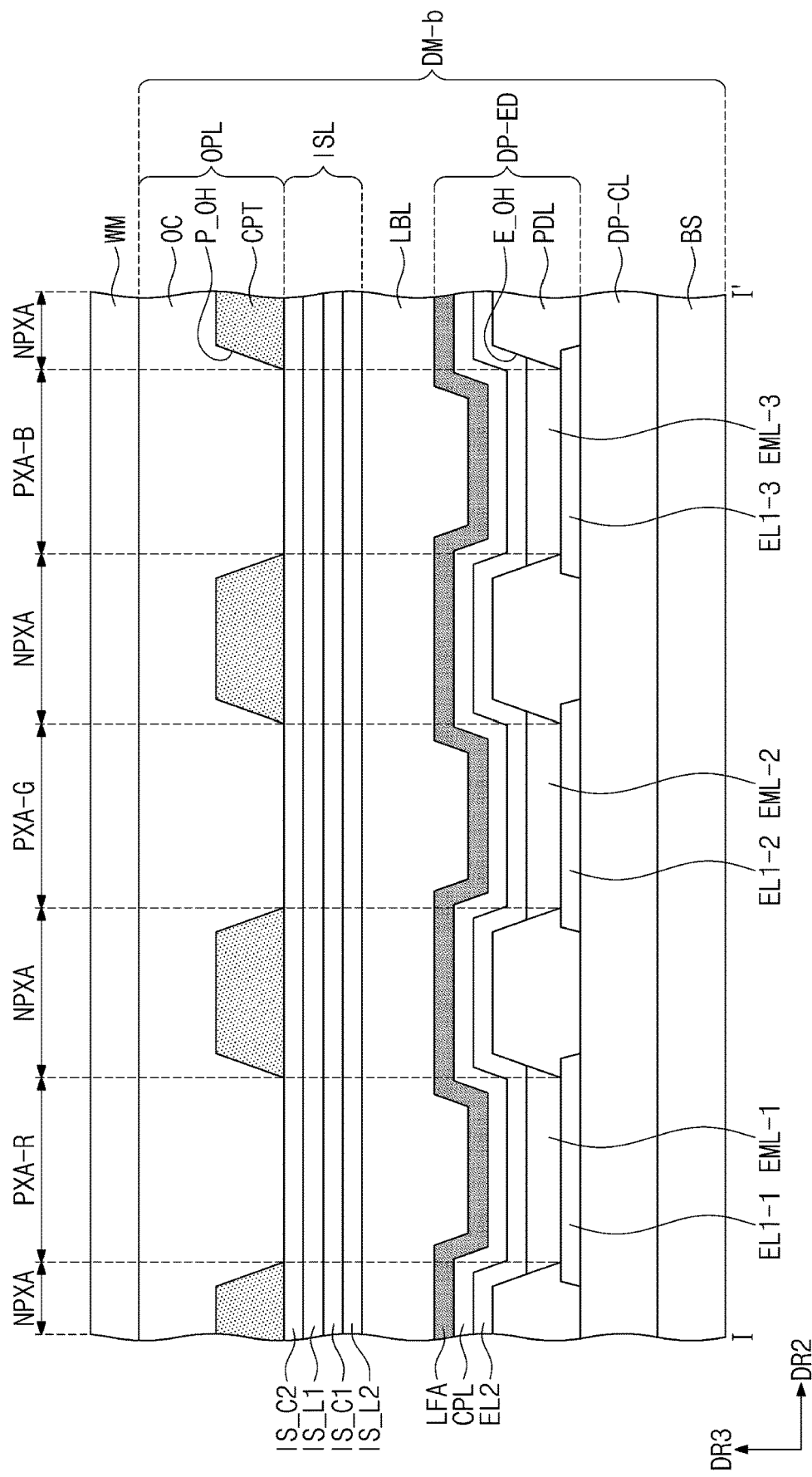
FIG. 6 is a cross-sectional view showing a display device according to an embodiment of the present disclosure.

When compared to the display module DM explained referring to FIG. 3, it could be found that a display module DM-b shown in FIG. 6 includes an ultraviolet blocking layer LBL between a display element layer DP-ED and an optical control layer OPL, and the display element layer DP-ED does not include an encapsulation part TFE (FIG. 3). More particularly, in FIG. 6, the ultraviolet blocking layer LBL is disposed between the display element layer DP-ED and an input sensitive layer ISL. The ultraviolet blocking layer LBL may be provided in place of the encapsulation part TFE (FIG. 3) of the display element layer DP-ED. The ultraviolet blocking layer LBL disposed between the display element layer DP-ED and the optical control layer OPL may have a transmittance of about 10% or less with respect to light in a wavelength region of about 410 nm or less.

Figure 7:
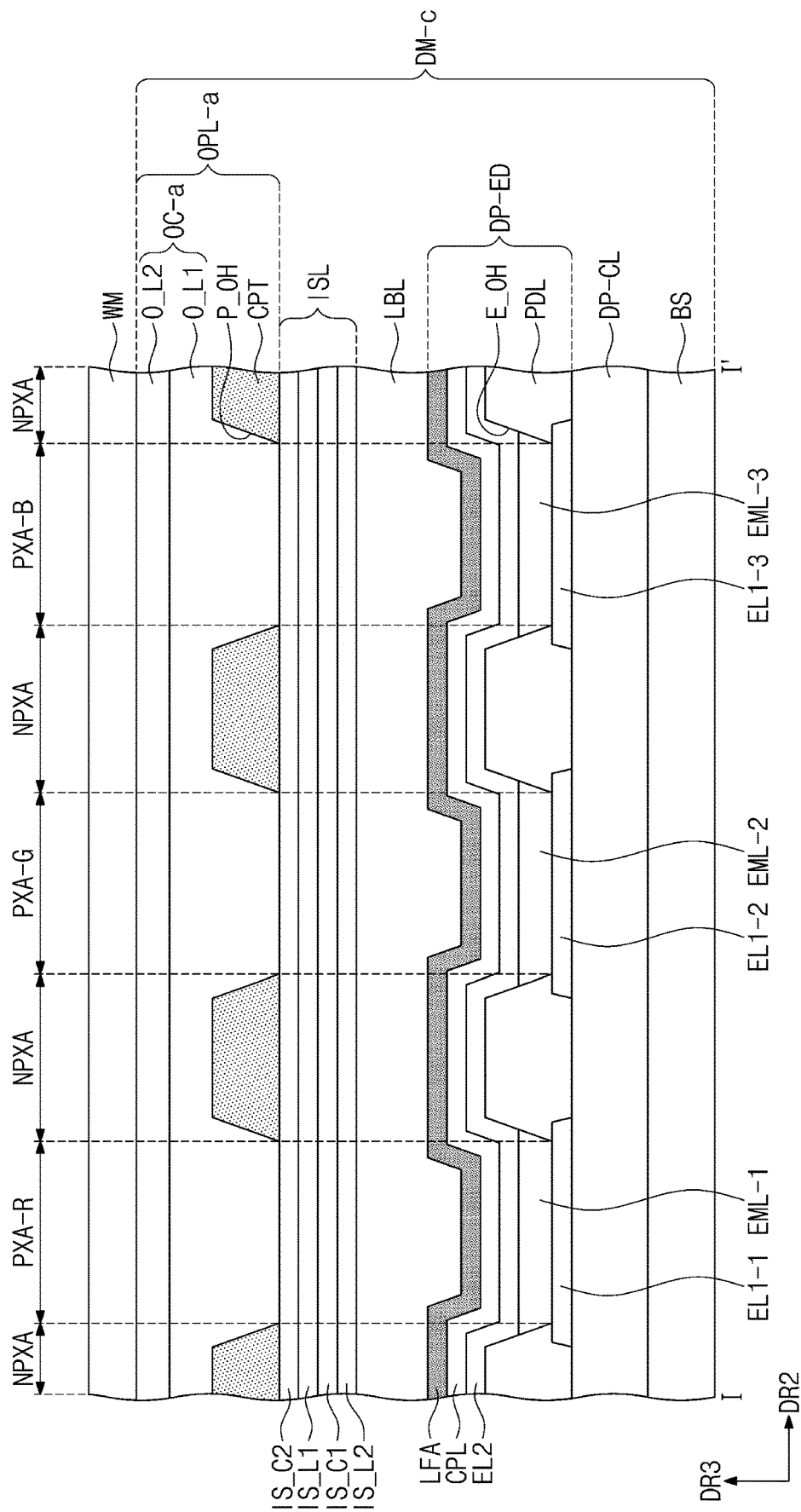
FIG. 7 is a cross-sectional view showing a display device according to an embodiment of the present disclosure.

When compared to the display module DM explained referring to FIG. 3, it could be found that a display module DM-c shown in FIG. 7 includes multiple overcoat layers OC-a of an optical control layer OPL-a, and includes an ultraviolet blocking layer LBL between a display element layer DP-ED and an optical control layer OPL-a. In addition, the display element layer DP-ED of FIG. 7 does not include the encapsulation part TFE (FIG. 3).

Referring to FIG. 7, multiple overcoat layers OC-a may include a first layer O_L1 and a second layer O_L2 disposed on the first layer O_L1. The first layer O_L1 may include an optically transparent organic material and have a planar top surface. The first layer O_L1 may be disposed on a color pattern part CPT and may fill up a pattern opening P_OH. The second layer O_L2 may include an optical clear adhesive (OCA) and/or a pressure sensitive adhesive (PSA). The second layer O_L2 may be disposed adjacent to a low reflective window WM. Multiple overcoat layers OC-a may be provided in place of the overcoat layers OC having a single layer for the display modules DM and DM-a of FIG. 3 and FIG. 5.

Figure 8:
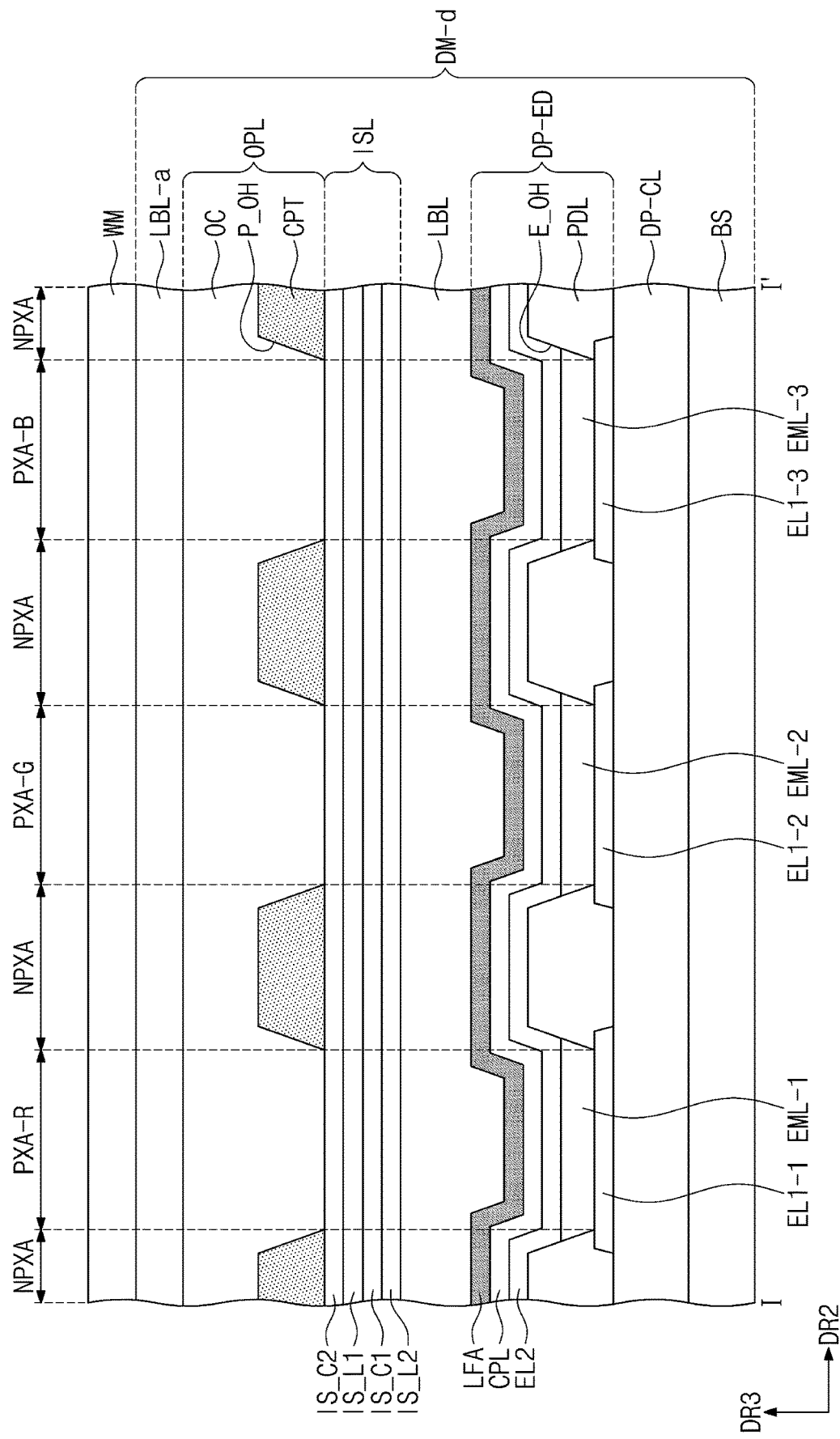
FIG. 8 is a cross-sectional view showing a display device according to an embodiment of the present disclosure.

When compared to the display module DM explained referring to FIG. 3, it could be found that a display module DM-d shown in FIG. 8 may include ultraviolet blocking layers LBL and LBL-a between a display element layer DP-ED and an optical control layer OPL, and between an optical control layer OPL and a low reflective window WM. For example, the display module DM-b shown in FIG. 8 may include two ultraviolet blocking layers LBL and LBL-a disposed between the display element layer DP-ED and the optical control layer OPL, and between the optical control layer OPL and the low reflective window WM. The ultraviolet blocking layer LBL disposed between the display element layer DP-ED and the optical control layer OPL may include an absorbent absorbing light in a wavelength region of about 410 nm or less. The ultraviolet blocking layer LBL-a disposed between the optical control layer OPL and the low reflective window WM may have a transmittance of about 10% or less with respect to light in a wavelength region of about 410 nm. The multiple overcoat layers OC-a shown in FIG. 7 may be provided in place of an overcoat layer OC of a single layer in the display module DM-d of FIG. 8.

Hereinafter, a display device including a low reflective window, a color pattern part and an encapsulation part according to an embodiment of the inventive concept will be explained in particular referring to embodiments and comparative embodiments. The embodiments below are illustrations to assist the understanding of the inventive concept, and the scope of the inventive concept is not necessarily limited thereto.

Table 1 below shows simulation results of light efficiency and the area of each light emitting area in the display devices of Comparative Example X1, Comparative Example X2 and Example A1. The area of each light emitting area is shown as an area ratio on a plane perpendicular to the thickness direction of the display device, and shown as an area ratio excluding the area of a non-luminous area based on 100% of the total area. For example, in Table 1, the remainder excluding the total area of luminous areas corresponds to the total area of a non-luminous area. For example, in Example A1, 63.36% obtained by subtracting 36.64% which is the sum of 7.82%, 11.94% and 16.88%, from 100% corresponds to the total area of the non-luminous area.

The total area of the first luminous areas in FIG. 2 corresponds to the area of a red light emitting area in Table 1, the total area of the second luminous areas in FIG. 2 corresponds to the area of a green light emitting area in Table 1, and the total area of the third luminous areas in FIG. 2 corresponds to the area of a blue light emitting area in Table 1.

The display devices of Comparative Example X1, Comparative Example X2 and Example A1 have a lifetime of about 900 hours to about 1000 hours. Example A1 is the display device according to an embodiment of the present disclosure and is a display device corresponding to FIG. 3, and Comparative Example X1 is a display device including a polarization plate disposed on a display element layer and not including an optical control layer. Comparative Example X2 is a display device including a color filter disposed on a display element layer and not including an optical control layer. In Table 1, the life efficiency is shown as relative values with the luminance of Comparative Example X1 as 100% with respect to the luminance of white light.

TABLE 1

| Division | Light efficiency | Area | | |
|---|---|---|---|---|
| | | Red light emitting area | Green light emitting area | Blue light emitting area |
| Comparative Example X1 | 100% | 14.40% | 23.82% | 25.45% |
| Comparative Example X2 | 138% | 10.82% | 18.39% | 15.48% |
| Example A1 | 167% | 7.82% | 11.94% | 16.88% |

Referring to Table 1, compared to Comparative Examples X1 and X2, it could be found that Example A1 shows high light efficiency. Example A1 having high light efficiency may show long-life characteristics when compared to Comparative Examples X1 and X2. Example A1 showing high light efficiency and long-life characteristics may form smaller light emitting areas than those of Comparative Examples X1 and X2. Example A1 having reduced light emitting areas may show increased reflectivity.

More particularly, compared to the area of the red light emitting area of Comparative Example X1, it could be found that the area of the red light emitting area of Example A1 shows a reduced value by about 30% or more. The value reduced by about 30% from the area of about 14.40% of the red light emitting area of Comparative Example X1 is about 10.08%. In addition, it could be found that the area of the green light emitting area of Example A1 shows a reduced value by about 30% or more of the area of the green light emitting area of Comparative Example X1. It could be found that the area of the blue light emitting area of Example A1 shows a reduced value by about 30% or more of the area of the blue light emitting area of Comparative Example X1. Accordingly, it is thought that the display device, according to an embodiment of the present disclosure, shows excellent light efficiency, reduced area of each light emitting area, and increased reflectivity.

In Table 2 below, transmittance, reflectivity and reflection color change measured in Comparative Example Y1 and Example B1 are shown. Comparative Example Y1 and Example B1 correspond to display devices including the same elements except for a window. Example B1 includes a low reflective window according to an embodiment of the present disclosure, and Comparative Example Y1 includes a common window.

In Table 2, the "reflection color change according to viewing angle of SCI" represents the change value of reflection color measured at a position with left and right viewing angles of 45° based on the front. The "front reflection color change of SCI" and the "front reflection color change of specular component excluded (SCE)" represent the change values of reflection color measured from the front, in a state of the screen of a display device not turned on. Comparative Example Y1 shows no change of front reflection color. The reflection color change is represented by using "a*" and "b*", which are color coordinates of CIE Lab, and "a*" corresponds to the degrees of red (positive (+) value) and green (negative (−) value), and "b*" corresponds to the degrees of yellow (positive (+) value) and blue (negative (−) value). If the reflection color change value is about 1.0 or less, the display device shows excellent display quality.

In Table 2, the reflectivity and the reflection color change were evaluated using a spectro photo meter of CM3700-A (Konica Minolta, Inc.), and measured in an integrating sphere under a standard light source of D65. The transmittance with respect to light of wavelengths of about 450 nm, about 550 nm, about 650 nm and about 940 nm was evaluated using a UV-Vis spectrometer of UV-1800 (Shimadzu Corporation). The UV-Vis spectrometer and PC were connected, a wave band for measurement and a measurement mode were selected, a base line was set, and Auto zero calibration was performed. Then, glass and a reference specimen were put and measured to confirm consistency, and the transmittance of samples (Comparative Example Y1 and Example B1) was measured.

TABLE 2

| Division | Comparative Example Y1 | Example B1 |
|---|---|---|
| Transmittance to light with wavelength of about 450 nm | 91.77% | 93.83% |
| Transmittance to light with wavelength of about 550 nm | 91.96% | 94.10% |
| Transmittance to light with wavelength of about 650 nm | 91.96% | 93.74% |
| Transmittance to light with wavelength of about 940 nm | 91.41% | 92.36% |
| SCI reflectivity | 5.96% | 3.71% |
| Reflection color change according to viewing angle of SCI (Δa*b*) | 0.24 | 0.90 |
| Front reflection color change of SCI (Δa*b*) | — | 0.61 |
| Front reflection color change of SCE (Δa*b*) | — | 0.09 |

Referring to Table 2, compared to Comparative Example Y1, it could be found that Example B1 shows a reduced SCI reflectivity by about 2125%. It could be found that Example B1 shows a SCI reflectivity of about 3.71%, and the SCI reflectivity corresponds to a range of about 4.12% or less. It could be found that Example B1 shows reflection color change values of about 0.90, about 0.61, and about 0.09, which are values of about 1.0 or less. In addition, it could be found that Example B1 shows excellent transmittance with respect to light of wavelengths of about 450 nm, about 550 nm, about 650 nm and about 940 nm. Accordingly, it is thought that the display device including a low reflective window according to an embodiment of the present disclosure will show excellent display quality, transmittance and reflectivity.

Figure 9:
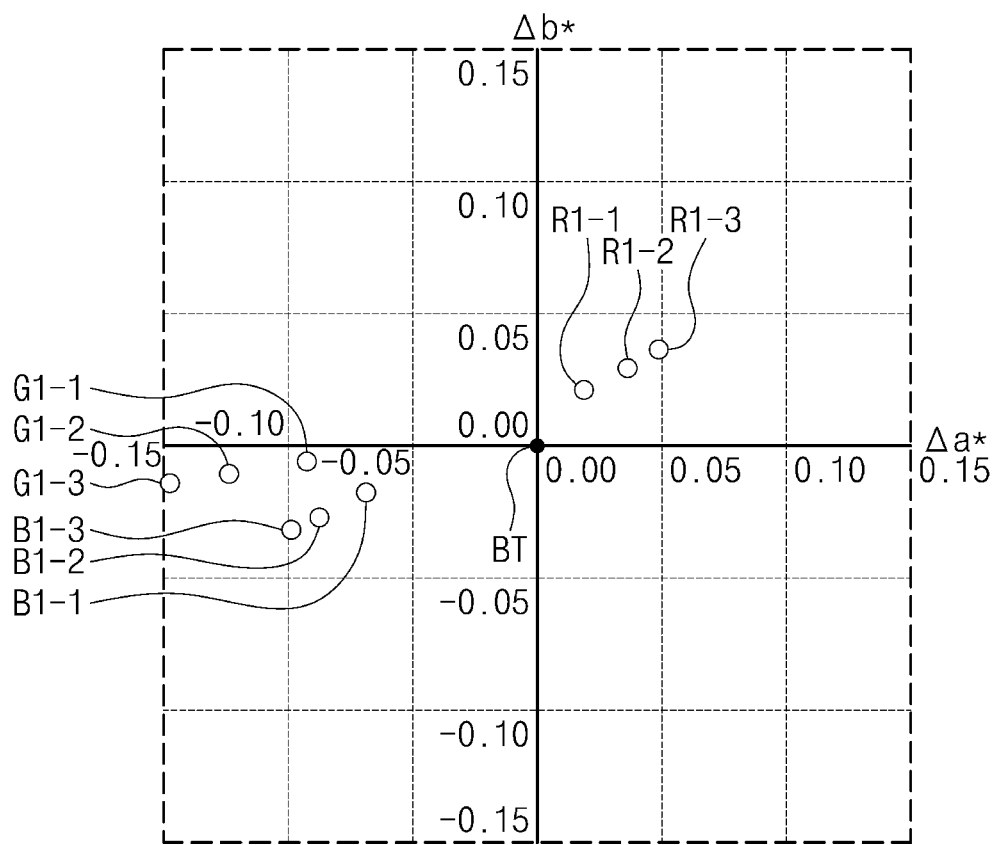
FIG. 9 is a graph showing color coordinates according to the addition of pigments.

FIG. 9 is a graph showing color coordinates according to the addition of pigments, where a horizontal axis is Δa* of CIE Lab, and a vertical axis is Δb* of CIE Lab. To a color pattern part including a black pigment, a red pigment, a green pigment, or a blue pigment was added, and color change was evaluated. The graph of FIG. 9 shows evaluation results using a spectro photo meter of CM3700-A (Konica Minolta, Inc.).

In FIG. 9, point BT where Δa* and Δb* are 0.00, corresponds to a case of including only a black organic pigment. In FIG. 9, R1-1 to R1-3 are cases including a R177 red pigment, G1-1 to G1-3 are cases including a G7 green pigment, and B1-1 to B1-3 are cases including a B15:6 blue pigment. Table 3 shows the weight ratio (wt %) of the pigment added, and the Δa* and Δb* of FIG. 9, in particular. R177 is a known material of 1-amino-4-(4-amino-9,10-dioxoanthracen-1-yl)anthracene-9,10-dione, G7 is a known material of phthalocyanine green G, and B15:6 is a known material of Cu-phthalocyanine.

TABLE 3

| Division | R1-1 | R1-2 | R.1-3 |
|---|---|---|---|
| R177, wt % | 1.20 | 1.97 | 2.73 |
| Δa* | 0.02 | 0.04 | 0.05 |
| Δb* | 0.02 | 0.03 | 0.03 |
| Division | G1-1 | G1-2 | G1-3 |
| G7, wt % | 0.94 | 1.54 | 2.13 |
| Δa* | −0.09 | −0.13 | −0.15 |
| Δb* | −0.01 | −0.01 | −0.02 |
| Division | B1-1 | B1-2 | B1-3 |
| B15:6, wt % | 0.90 | 1.50 | 2.00 |
| Δa* | −0.07 | −0.09 | −0.10 |
| Δb* | −0.02 | −0.03 | −0.03 |

Referring to FIG. 9 and Table 3, it could be found that color changes according to the amount of the pigment included in the color pattern part. Accordingly, it could be thought that the display quality of a display device may be increased by controlling the amount of the pigment included in the color pattern part according to an embodiment of the present disclosure.

Table 4 below shows a SCE reflectivity and reflection color change according to the addition or not of a pigment in display devices of the Comparative Example and Experimental Examples. Table 4 shows evaluation results using a spectro photo meter of CM3700-A (Konica Minolta, Inc.).

The display devices of the Comparative Example and Experimental Examples correspond to the display device of FIG. 3. Comparative Example Z1 is a case not including a pigment in an overcoat layer and a touch insulating layer, Experimental Examples C1 and C2 are cases including all of a red colorant, a green colorant and a blue colorant in an overcoat layer. Experimental Example C3 is a case including all of a red colorant, a green colorant and a blue colorant in a touch insulating layer. In Table 4, a* and b* are color coordinates of CIE Lab.

TABLE 4

| Division | Comparative Example Z1 | Experimental Example C1 | Experimental Example C2 | Experimental Example C3 |
|---|---|---|---|---|
| SCE reflectivity | 0.68% | 0.55% | 0.43% | 0.53% |
| a*/b* of SCE | 2.31/4.02 | 1.94/3,12 | 1.57/2.31 | 1.69/3.06 |

Referring to Table 4, compared to Comparative Example Z1, Experimental Examples C1 to C3 shows reduced reflectivity and at the same time, changed color coordinates. Accordingly, it is though that a display device according to an embodiment of the present disclosure, including at least one colorant among a red colorant, a green colorant and a blue colorant in an overcoat layer and/or a touch insulating layer may provide desired display quality.

Figure 10:
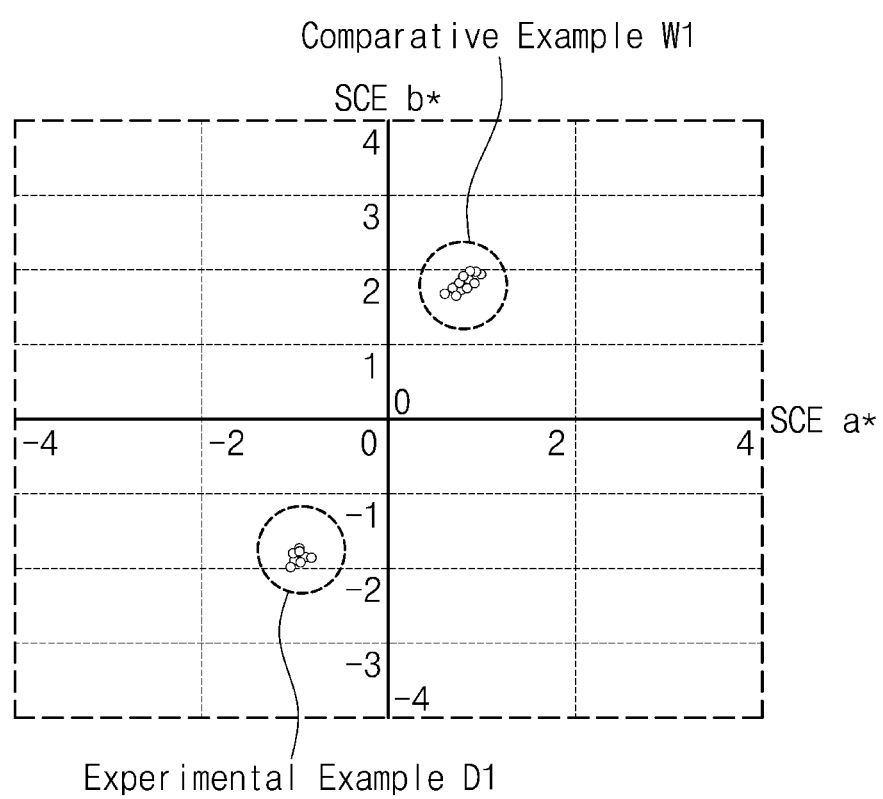
FIG. 10 is a graph showing evaluation results of the color coordinates of SCE in a comparative embodiment and an experimental embodiment.

FIG. 10 is a graph showing evaluation results of the color coordinates of SCE in Comparative Example W1 and Experimental Example D1, and multiple equivalent samples were manufactured and evaluated for each of Comparative Example W1 and Experimental Example D1. The graph of FIG. 10 shows evaluation results using a spectro photo meter of CM3700-A (Konica Minolta, Inc.).

Comparative Example W1 and Experimental Example D1 have a different refractive index and thickness of an encapsulation part. Table 5 shows the refractive index and thickness of each of a first encapsulation layer, a second encapsulation layer, and a third encapsulation layer in Comparative Example W1 and Experimental Example D1. Comparative Example W1 does not include the third encapsulation layer. Experimental Example D1 satisfies the ranges of the thickness and refractive index of each of the first encapsulation layer, the second encapsulation layer, and the third encapsulation layer according to an embodiment of the present disclosure.

TABLE 5

| Division | | First encapsulation layer | Second encapsulation layer | Third encapsulation layer |
|---|---|---|---|---|
| Comparative Example W1 | Refractive index | 1.77 | 1.62 | — |
| | Thickness (Å) | 11000 | 700 | — |
| Experimental Example D1 | Refractive index | 1.89 | 1.48 | 1.77 |
| | Thickness (Å) | 500 | 1000 | 9000 |

Referring to Table 5, in Comparative Example W1, it could be found that the thickness of the first encapsulation layer disposed at the lower part based on a thickness direction is greater than the thickness of the second encapsulation layer. In Experimental Example D1, the second encapsulation layer disposed between the first encapsulation and the third encapsulation layer based on a thickness direction has a smaller refractive index than the first encapsulation layer and the third encapsulation layer. In addition, Experimental Example D1 satisfies the above-described thickness and refractive index ranges of the first to third encapsulation layers.

Referring to FIG. 10, it could be found that the values of a* and b* show positive values in Comparative Example W1, and the values of a* and b* show negative values in Experimental Example D1. Cases of showing positive values of a* and b* correspond to red and yellow series, and cases of showing negative values of a* and b* correspond to green and blue series. Accordingly, it is thought that the display quality of a display device could be increased to a desired level by controlling the refractive index and/or thickness of the encapsulation layer according to an embodiment of the present disclosure.

A display device according to an embodiment of the present disclosure may include a luminous area and a non-luminous area. The display device includes a display element layer, an optical control layer, and a low reflective window, stacked in this order, and the low reflective window has a SCI reflectivity of about 4.12% or less. The display element layer may include a low reflective layer disposed on a second electrode, and the low reflective layer may include bismuth and/or ytterbium. The optical control layer may include a color pattern part non-overlapping the luminous area, and an overcoat layer disposed on the color pattern layer and overlapping the luminous area and non-luminous area. The color pattern part may include a red colorant, a green colorant and/or a blue colorant. The overcoat layer may be optically transparent and may be disposed while filling up a pattern opening defined in the color pattern part. Accordingly, the display device, according to an embodiment of the present disclosure, may show increased display quality and efficiency.

The display device, according to an embodiment of the present disclosure, includes an optical control layer disposed on a display element layer, and a low reflective window disposed on the optical control layer, and may show increased properties of efficiency and display quality.

Although the embodiments of the present invention have been described, it is understood that the present invention should not necessarily be limited to these embodiments, but various changes and modifications can be made by one ordinary skilled in the art within the spirit and scope of the present disclosure.

What is claimed is:

1. A display device, comprising:
   a luminous area;
   a non-luminous area;
   a display element layer;
   an optical control layer disposed on the display element layer; and
   a low reflective window disposed on the optical control layer,
   wherein the display element layer comprises:
      a pixel definition film in which a pixel opening is defined;
      a first electrode exposed through the pixel opening;
      an emission layer disposed on the first electrode;
      a second electrode disposed on the emission layer; and
      a low reflective layer disposed on the second electrode and comprising bismuth (Bi) and/or ytterbium (Yb), and
   wherein the optical control layer comprises:
      a color pattern part non-overlapping the luminous area; and
      an overcoat layer disposed on the color pattern part and overlapping each of the luminous area and the non-luminous area.

2. The display device of claim 1, further comprising an ultraviolet blocking layer disposed between the display element layer and the optical control layer and/or disposed between the optical control layer and the low reflective window, the ultraviolet blocking layer having a transmittance of about 10% or less with respect to light in a wavelength region of about 410 nm or less, and
wherein the low reflective window has a specular component included (SCI) reflectivity of about 4.12% or less.

3. The display device of claim 1, the display device is a cellular phone, a smart phone, a tablet computer, a vehicle navigation system, a portable game console, or a wearable device.

4. The display device of claim 1, wherein
the color pattern part comprises a first colorant, or the color pattern part comprises the first colorant and a black colorant, and
the first colorant comprises a red colorant, a green colorant, and/or a blue colorant.

5. The display device of claim 4, wherein a weight of the first colorant is less than about 50 wt % based on a total weight of the color pattern part.

6. The display device of claim 4, wherein,
where the color pattern part comprises any one colorant among the red colorant, the green colorant, and/or the blue colorant, a weight of the any one colorant is about 15 wt % or less based on a total weight of the color pattern part, and
where the color pattern part comprises any two colorants among the red colorant, the green colorant, and the blue colorant, a weight of each of the any two colorants is about 15 wt % or less based on a total weight of the color pattern part.

7. The display device of claim 1, wherein the color pattern part has an optical density (OD) of about 1.0 or more per 1 μm of a unit thickness.

8. The display device of claim 1, wherein the color pattern part has a transmittance of about 80% or more with respect to light in a wavelength region of about 940 nm or more and has a specular component included (SCI) reflectivity of less than about 5%.

9. The display device of claim 1, wherein the low reflective layer has a refractive index of about 1.4 to about 3.0, and has an absorption coefficient (k) of about 1.5 or less.

10. The display device of claim 1, wherein
the display element layer further comprises a capping layer disposed between the second electrode and the low reflective layer,
a thickness of the second electrode is about 95 Å to about 200 Å,
a thickness of the capping layer is about 200 Å to about 1000 Å, and
a thickness of the low reflective layer is about 50 Å to about 150 Å.

11. The display device of claim 1, wherein
the display element layer further comprises an encapsulation part disposed on the low reflective layer, and
the encapsulation part comprises a first encapsulation layer, a second encapsulation layer stacked on the first encapsulation layer, and a third encapsulation layer stacked on the second encapsulation layer, wherein a refractive index of the second encapsulation layer is smaller than each of a refractive index of the first encapsulation layer and a refractive index of the third encapsulation layer.

12. The display device of claim 11, wherein
the refractive index of the first encapsulation layer is about 1.6 to about 2.2,
the refractive index of the second encapsulation layer is about 1.2 to about 1.8, and
the refractive index of the third encapsulation layer is about 1.5 to about 2.1.

13. The display device of claim 11, wherein
the first encapsulation layer comprises silicon nitride, and the second encapsulation layer and the third encapsulation layer each comprise silicon oxynitride,
a thickness of the first encapsulation layer is about 200 Å to about 3000 Å, a thickness of the second encapsulation layer is about 500 Å to about 4000 Å, and a thickness of the third encapsulation layer is about 4000 Å to about 12000 Å.

14. The display device of claim 1, further comprising an input sensitive layer disposed between the display element layer and the optical control layer,
wherein the input sensitive layer comprises a first conductive layer, a second conductive layer disposed on the first conductive layer, and a touch insulating layer disposed between the first conductive layer and the second conductive layer, and
wherein the touch insulating layer and/or the overcoat layer comprises a second colorant, the second colorant comprising a red colorant, a green colorant, and/or a blue colorant.

15. The display device of claim 14, wherein the second colorant absorbs light in a wavelength region of about 420 nm to about 440 nm, or in a wavelength region of about 570 nm to about 590 nm.

16. The display device of claim 14, wherein,
where the touch insulating layer comprises the second colorant, a weight of the second colorant is about 3 wt % or less based on a total weight of the touch insulating layer, and
where the overcoat layer comprises the second colorant, a weight of the second colorant is about 3 wt % or less based on a total weight of the overcoat layer.

17. The display device of claim 14, wherein,
where the touch insulating layer comprises the second colorant, the touch insulating layer has a transmittance of about 90% or more with respect to light in a wavelength region of about 380 nm to about 780 nm, and
where the overcoat layer comprises the second colorant, the overcoat layer has a transmittance of about 90% or more with respect to light in a wavelength region of about 380 nm to about 780 nm.

18. A display device, comprising:
a display element layer;
an optical control layer disposed on the display element layer; and
a low reflective window disposed on the optical control layer and having a specular component included (SCI) reflectivity of about 4.12% or less,
wherein the display element layer comprises:
a pixel definition film in which a pixel opening is defined;
a first electrode exposed through the pixel opening;
an emission layer disposed on the first electrode;
a second electrode disposed on the emission layer; and
a low reflective layer disposed on the second electrode and comprising bismuth (Bi) and/or ytterbium (Yb), and
wherein the optical control layer comprises:
a color pattern part in which a pattern opening overlapping the pixel opening is defined, the color pattern part comprising a red colorant, a green colorant, and/or a blue colorant; and an optically transparent overcoat layer filling the pattern opening on the color pattern part.

19. The display device of claim 18, wherein the overcoat layer comprises an optical clear adhesive (OCA) and/or a pressure sensitive adhesive (PSA).

20. The display device of claim 18, further comprising an ultraviolet blocking layer disposed between the display element layer and the optical control layer and/or disposed between the optical control layer and the low reflective window, wherein the ultraviolet blocking layer has a transmittance of about 10% or less with respect to light in a wavelength region of about 410 nm or less.

* * * * *